(12) United States Patent
Hayashi et al.

(10) Patent No.: US 9,705,027 B2
(45) Date of Patent: Jul. 11, 2017

(54) SOLAR CELL MANUFACTURING METHOD USING ETCHING PASTE

(71) Applicant: Panasonic Intellectual Property Management Co., Ltd., Osaka (JP)

(72) Inventors: Naofumi Hayashi, Osaka (JP); Mitsuaki Morigami, Osaka (JP); Masato Shigematsu, Osaka (JP); Takahiro Mishima, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/164,874

(22) Filed: May 26, 2016

(65) Prior Publication Data

US 2016/0268470 A1 Sep. 15, 2016

Related U.S. Application Data

(63) Continuation of application No. PCT/JP2014/074395, filed on Sep. 16, 2014.

(30) Foreign Application Priority Data

Nov. 29, 2013 (JP) .................................. 2013-248010

(51) Int. Cl.
*H01L 21/00* (2006.01)
*H01L 31/20* (2006.01)
(Continued)

(52) U.S. Cl.
CPC .... *H01L 31/202* (2013.01); *H01L 31/022441* (2013.01); *H01L 31/022491* (2013.01);
(Continued)

(58) Field of Classification Search
CPC ........................... H01L 31/0224; H01L 31/20
(Continued)

(56) References Cited

U.S. PATENT DOCUMENTS

| 7,935,966 B2 | 5/2011 | Ribeyron et al. |
| 8,421,074 B2 | 4/2013 | Cabarrocas et al. |

(Continued)

FOREIGN PATENT DOCUMENTS

| JP | 2008-529265 A | 7/2008 |
| JP | 2010-267787 A | 11/2010 |

(Continued)

OTHER PUBLICATIONS

International Search Report issued for the international application No. PCT/JP2014/074395 on Oct. 21, 2014.

*Primary Examiner* — Caleb Henry
(74) *Attorney, Agent, or Firm* — Mots Law, PLLC

(57) ABSTRACT

A solar cell manufacturing method includes: forming a first amorphous semiconductor layer of one conductivity type on a main surface of a semiconductor substrate; forming an insulation layer on the first amorphous semiconductor layer; etching to remove the insulation layer and the first amorphous semiconductor layer in a predetermined first region; forming a second amorphous semiconductor layer of an other conductivity type on the insulation layer after the etching, the other conductivity type being different from the one conductivity type; and etching to remove the second amorphous semiconductor layer in a predetermined second region, wherein the etching to remove the insulation layer and the first amorphous semiconductor layer in a predetermined first region includes: applying an etching paste to the insulation layer in the predetermined first region; and etching to remove the insulation layer and the first amorphous semiconductor layer in the predetermined first region using the etching paste.

10 Claims, 5 Drawing Sheets

(51) Int. Cl.
*H01L 31/0747* (2012.01)
*H01L 31/0224* (2006.01)
*H01L 31/18* (2006.01)

(52) U.S. Cl.
CPC ...... *H01L 31/0747* (2013.01); *H01L 31/1804* (2013.01); *Y02E 10/547* (2013.01); *Y02P 70/521* (2015.11)

(58) Field of Classification Search
USPC ......................................................... 438/98
See application file for complete search history.

(56) References Cited

U.S. PATENT DOCUMENTS

| | | |
|---|---|---|
| 9,142,706 B2 | 9/2015 | Mishima |
| 2008/0061293 A1 | 3/2008 | Ribeyron et al. |
| 2008/0200036 A1* | 8/2008 | Stockum ................ C03C 15/00 438/756 |
| 2011/0120541 A1 | 5/2011 | Cabarrocas et al. |
| 2013/0137211 A1* | 5/2013 | Mishima ........... H01L 31/02167 438/98 |
| 2013/0186456 A1* | 7/2013 | Ide ................. H01L 31/035281 136/255 |

FOREIGN PATENT DOCUMENTS

| | | |
|---|---|---|
| JP | 2012-028718 A | 2/2012 |
| WO | 2011-093329 A1 | 8/2011 |
| WO | 2012-014960 A1 | 2/2012 |
| WO | 2012-132613 A1 | 10/2012 |

\* cited by examiner

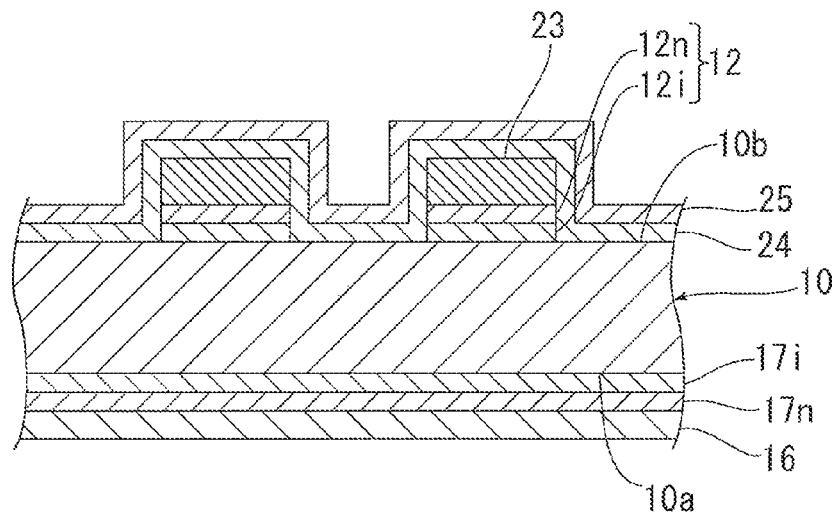
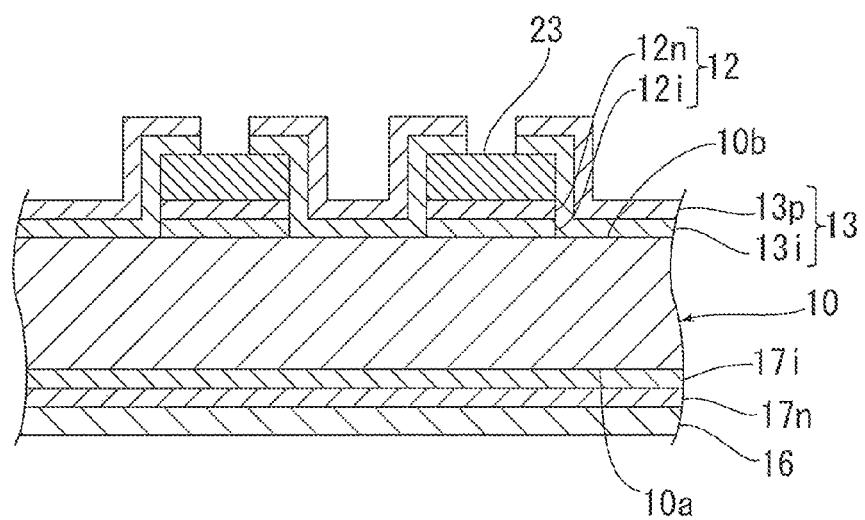
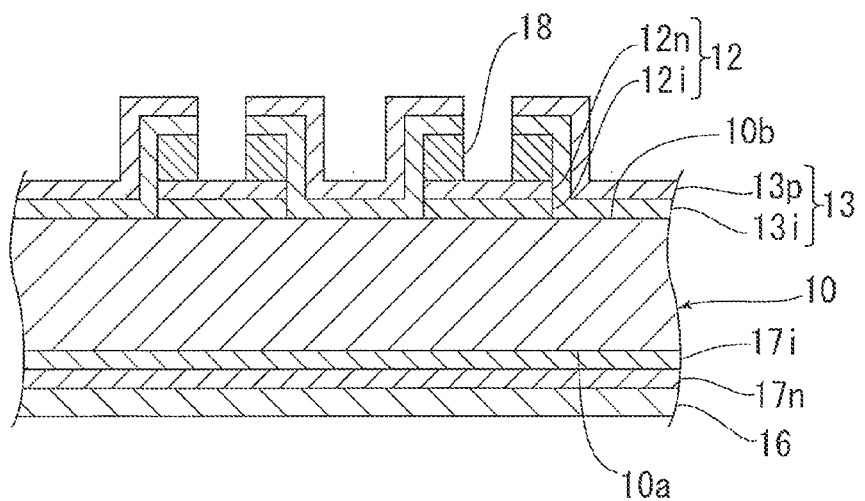

SOLAR CELL MANUFACTURING METHOD USING ETCHING PASTE

CROSS REFERENCE TO RELATED APPLICATIONS

This application is a U.S. continuation application of PCT International Patent Application Number PCT/JP2014/074395 filed on Sep. 16, 2014, claiming the benefit of priority of Japanese Patent Application Number 2013-248010 filed on Nov. 29, 2013, the entire contents of which are hereby incorporated by reference.

TECHNICAL FIELD

The present disclosure relates to a solar cell manufacturing method.

BACKGROUND ART

In a back contact solar cell, to form a p-type semiconductor layer and an n-type semiconductor layer on the back surface of a semiconductor substrate, an insulation layer is provided between the p-type semiconductor layer and the n-type semiconductor layer.

According to Japanese Unexamined Patent Application Publication No. 2012-28718 (Patent Literature (PTL) 1), after a p-type or n-type semiconductor layer is formed on the back surface of a semiconductor substrate, an insulation layer is formed on the p-type or n-type semiconductor layer. The insulation layer is first etched with an acidic etchant and patterned, by photolithography. The patterned insulation layer is then used as a mask, to etch the p-type or n-type semiconductor layer with an alkaline etchant.

According to Japanese Unexamined Patent Application Publication No. 2008-529265 (PTL 2), an insulation layer and an amorphous semiconductor layer are formed on the back surface of a semiconductor substrate, and each layer is etched by laser etching or an etching paste to manufacture a solar cell having an interdigital structure.

SUMMARY

The present disclosure provides a method that can manufacture a solar cell of back contact type or the like more easily.

A solar cell manufacturing method according to an aspect of the present disclosure includes: forming a first amorphous semiconductor layer of one conductivity type on a main surface of a semiconductor substrate; forming an insulation layer on the first amorphous semiconductor layer; etching to remove the insulation layer and the first amorphous semiconductor layer in a predetermined first region; forming a second amorphous semiconductor layer of an other conductivity type on the insulation layer after the etching, the other conductivity type being different from the one conductivity type; and etching to remove the second amorphous semiconductor layer in a predetermined second region, wherein the etching to remove the insulation layer and the first amorphous semiconductor layer in a predetermined first region includes: applying an etching paste to the insulation layer in the predetermined first region; and etching to remove the insulation layer and the first amorphous semiconductor layer in the predetermined first region using the etching paste.

According to the present disclosure, a solar cell of back contact type or the like can be manufactured more easily.

BRIEF DESCRIPTION OF THE DRAWINGS

The figures depict one or more implementations in accordance with the present teaching, by way of examples only, not by way of limitations. In the figures, like reference numerals refer to the same or similar elements.

FIG. 7 is a schematic sectional view illustrating a solar cell manufacturing step in Embodiment 1.

FIG. 8 is a schematic sectional view illustrating a solar cell manufacturing step in Embodiment 1.

FIG. 9 is a schematic sectional view illustrating a solar cell manufacturing step in Embodiment 1.

DETAILED DESCRIPTION

Figure 1:
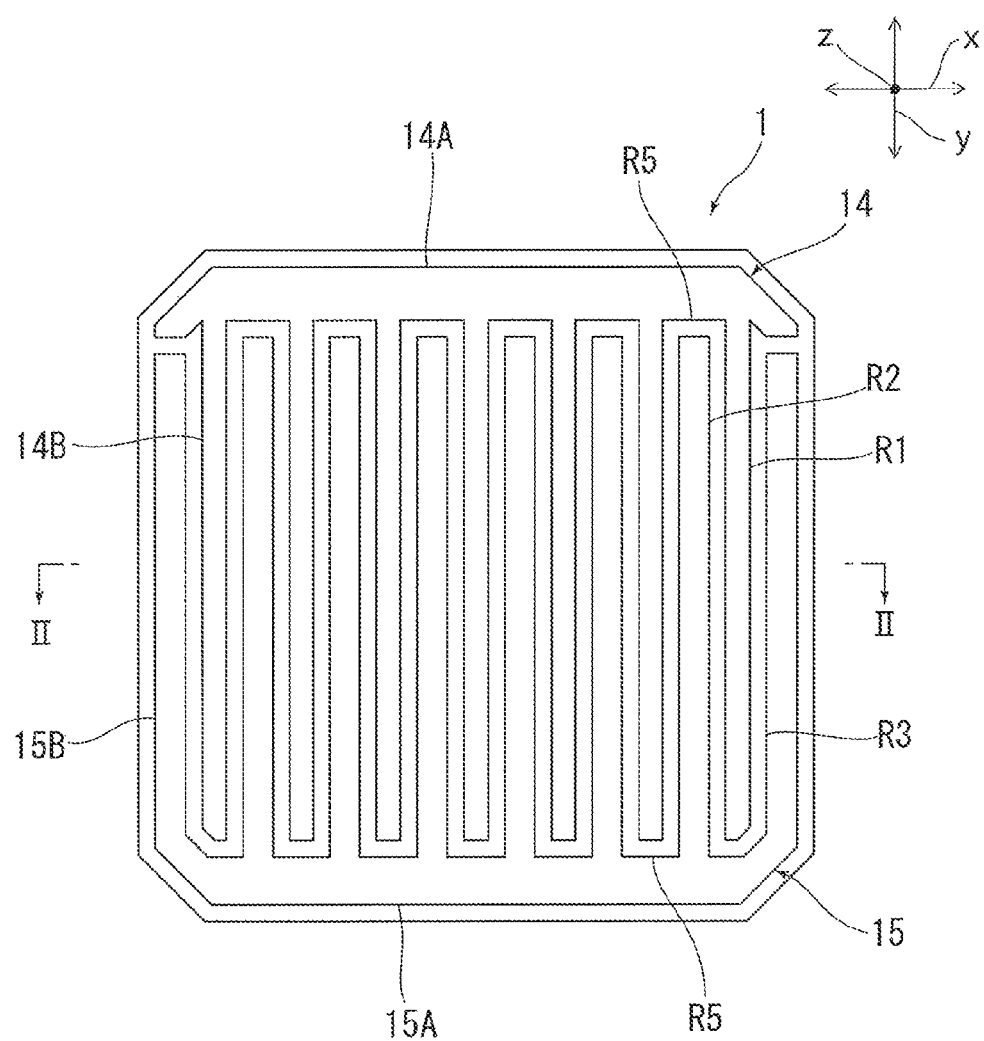
FIG. 1 is a schematic plan view illustrating a solar cell in Embodiments 1 and 2.

The following describes embodiments. The embodiments described below are merely illustrative, and are not intended to limit the scope of the present disclosure. In the drawings, the members having the substantially same functions may be given the same reference signs.

Solar Cell in Embodiments 1 and 2

Figure 2:
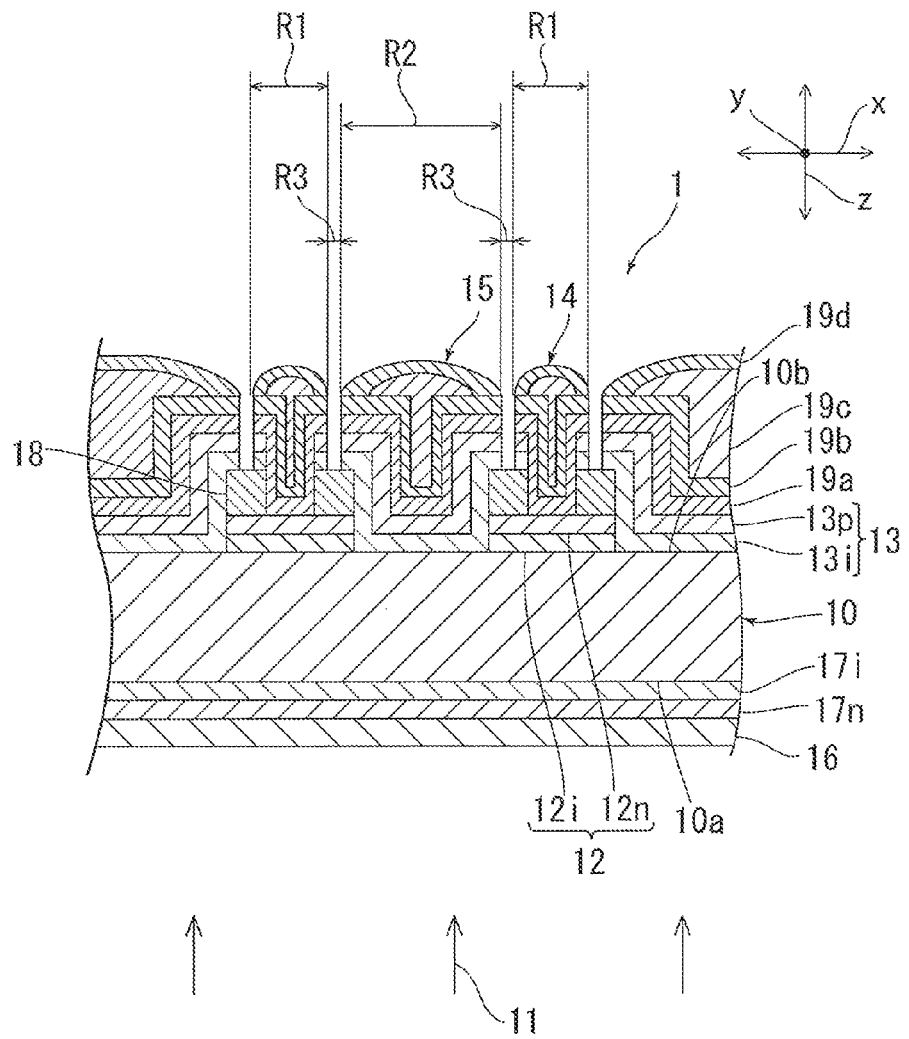
FIG. 2 is a partially enlarged schematic sectional view along line II-II in FIG. 1.

FIG. 1 is a schematic plan view illustrating a solar cell in Embodiments 1 and 2. FIG. 2 is a partially enlarged schematic sectional view along line II-II in FIG. 1.

A solar cell 1 is a back contact solar cell. FIG. 1 illustrates the back surface of the solar cell 1. The solar cell 1 includes a semiconductor substrate 10, as illustrated in FIG. 2. The semiconductor substrate 10 has a light receiving surface 10a and a back surface 10b. The semiconductor substrate 10 receives light 11 at the light receiving surface 10a, to generate carriers. The carriers are electron holes and electrons generated as a result of the semiconductor substrate 10 absorbing light.

The semiconductor substrate 10 is a crystalline semiconductor substrate having a conductivity type of n-type or p-type. A specific example of the crystalline semiconductor substrate is a crystalline silicon substrate such as a monocrystalline silicon substrate or a polycrystalline silicon substrate. The semiconductor substrate may be other than a crystalline semiconductor substrate. For example, the semiconductor substrate 10 may be a compound semiconductor substrate made of GaAs, InP, or the like. This embodiment describes an example where the semiconductor substrate 10 is a crystalline silicon substrate of n-type as one conductivity type.

An i-type amorphous semiconductor layer 17i made of a substantially intrinsic amorphous semiconductor (hereafter an intrinsic semiconductor is referred to as "i-type semiconductor") is formed on the light receiving surface 10a of the semiconductor substrate 10. In detail, the i-type amorphous semiconductor layer 17i in this embodiment is made of i-type amorphous silicon containing hydrogen. The thickness of the i-type amorphous semiconductor layer 17i is not particularly limited as long as it does not substantially contribute to electric power generation. The thickness of the i-type amorphous semiconductor layer 17i may be, for example, about few nm to 25 nm.

In the present disclosure, the term "amorphous semiconductor" may include a microcrystalline semiconductor. The microcrystalline semiconductor is a semiconductor having semiconductor crystals precipitated in an amorphous semiconductor.

An n-type amorphous semiconductor layer 17n having the same conductivity type as the semiconductor substrate 10 is formed on the i-type amorphous semiconductor layer 17i. The n-type amorphous semiconductor layer 17n is an amorphous semiconductor layer having n-type conductivity, with an n-type dopant added to it. In detail, the n-type amorphous semiconductor layer 17n in this embodiment is made of n-type amorphous silicon containing hydrogen. The thickness of the n-type amorphous semiconductor layer 17n is not particularly limited. The thickness of the n-type amorphous semiconductor layer 17n may be, for example, about 2 nm to 50 nm.

An insulation layer 16 that functions as both an antireflection film and a protection film is formed on the n-type amorphous semiconductor layer 17n. For example, the insulation layer 16 may be made of silicon oxide, silicon nitride, or silicon oxynitride. The thickness of the insulation layer 16 may be appropriately set depending on, for example, the desired antireflection property of the antireflection film. The thickness of the insulation layer 16 may be, for example, about 80 nm to 1000 nm.

The stack structure of the i-type amorphous semiconductor layer 17i, n-type amorphous semiconductor layer 17n, and insulation layer 16 functions as an antireflection film and a passivation layer of the semiconductor substrate 10.

An n-type semiconductor stack structure 12 of one conductivity type and a p-type semiconductor stack structure 13 of the other conductivity type are formed on the back surface 10b of the semiconductor substrate 10. An n-type region R1 which is a region of one conductivity type has the n-type semiconductor stack structure 12, and a p-type region R2 which is a region of the other conductivity type has the p-type semiconductor stack structure 13. As illustrated in FIG. 1, each of the n-type region R1 and the p-type region R2 is shaped like a tooth of a comb. The n-type regions R1 and the p-type regions R2 interdigitate each other. Thus, the n-type region R1 and the p-type region R2 alternate along the direction x perpendicular to the intersection width direction y, on the back surface 10b. An insulation region R3 is set between the n-type region R1 and the p-type region R2. The insulation region R3 extends in the y direction, turns at a turn region R5, and then extends to the opposite side in the y direction, as illustrated in FIG. 1.

The n-type semiconductor stack structure 12 is a stack of an i-type amorphous semiconductor layer 12i as a first intrinsic semiconductor layer formed on the back surface 10b and an n-type amorphous semiconductor layer 12n formed on the i-type amorphous semiconductor layer 12i. The i-type amorphous semiconductor layer 12i is made of amorphous silicon containing hydrogen, as with the above-mentioned i-type amorphous semiconductor layer 17i. The thickness of the i-type amorphous semiconductor layer 12i is not particularly limited as long as it does not substantially contribute to electric power generation. The thickness of the i-type amorphous semiconductor layer 12i may be, for example, about few nm to 25 nm.

The n-type amorphous semiconductor layer 12n has the same n-type conductivity as the semiconductor substrate 10 with an n-type dopant added to it, as with the above-mentioned n-type amorphous semiconductor layer 17n. In detail, the n-type amorphous semiconductor layer 12n in this embodiment is made of n-type amorphous silicon containing hydrogen. The thickness of the n-type amorphous semiconductor layer 12n is not particularly limited. The thickness of the n-type amorphous semiconductor layer 12n may be, for example, about 2 nm to 50 nm.

An insulation layer 18 is formed on both end portions of the n-type semiconductor stack structure 12 except its center portion in the x direction. The center portion of the n-type semiconductor stack structure 12 in the x direction is exposed from the insulation layer 18. The material of the insulation layer 18 is not particularly limited. For example, the insulation layer 18 may be made of silicon oxide, silicon nitride, or silicon oxynitride. The insulation layer 18 is preferably made of silicon nitride. Moreover, the insulation layer 18 may contain hydrogen.

The p-type semiconductor stack structure 13 is formed on the part of the back surface 10b exposed from the n-type semiconductor stack structure 12 and on end portions of the insulation layer 18. The p-type semiconductor stack structure 13 is a stack of an i-type amorphous semiconductor layer 13i as a second intrinsic semiconductor layer formed on the back surface 10b and a p-type amorphous semiconductor layer 13p formed on the i-type amorphous semiconductor layer 13i.

The i-type amorphous semiconductor layer 13i is made of amorphous silicon containing hydrogen. The thickness of the i-type amorphous semiconductor layer 13i is not particularly limited as long as it does not substantially contribute to electric power generation. The thickness of the i-type amorphous semiconductor layer 13i may be, for example, about few nm to 25 nm.

The p-type amorphous semiconductor layer 13p is an amorphous semiconductor layer having p-type conductivity, with a p-type dopant added to it. In detail, the p-type amorphous semiconductor layer 13p in this embodiment is made of p-type amorphous silicon containing hydrogen. The thickness of the p-type amorphous semiconductor layer 13p is not particularly limited. The thickness of the p-type amorphous semiconductor layer 13p may be, for example, about 2 nm to 50 nm.

In this embodiment, the i-type amorphous semiconductor layer 13i with such a thickness that does not substantially contribute to electric power generation is provided between the crystalline semiconductor substrate 10 and the p-type amorphous semiconductor layer 13p. By providing the i-type amorphous semiconductor layer 13i between the n-type semiconductor substrate 10 and the p-type amorphous semiconductor layer 13p as in this embodiment, the recombination of minority carriers at the junction interface between the semiconductor substrate 10 and the p-type semiconductor stack structure 13 can be suppressed. This improves photoelectric conversion efficiency.

Each of the amorphous semiconductor layers 17i, 17n, 12, and 13 may contain hydrogen, to enhance the passivation property.

An n-side electrode 14 as an electrode on the side of one conductivity type, which collects electrons, is formed on the n-type amorphous semiconductor layer 12n. A p-side electrode 15 as an electrode on the side of the other conductivity type, which collects electron holes, is formed on the p-type amorphous semiconductor layer 13p. The p-side electrode 15 and the n-side electrode 14 are electrically insulated with the insulation region R3 interposed in between.

In this embodiment, each of the n-type region R1 and the p-type region R2 is shaped like a tooth of a comb, as mentioned earlier. Accordingly, the n-side electrode 14 has a bus bar 14A and a plurality of fingers 14B, and the p-side electrode 15 has a bus bar 15A and a plurality of fingers 15B, as illustrated in FIG. 1. Alternatively, each of the n-side electrode 14 and the p-side electrode 15 may be a bus-barless electrode made up of only a plurality of fingers without a bus bar.

Each of the n-side electrode 14 and the p-side electrode 15 is not particularly limited as long as it can collect carriers. In this embodiment, each of the n-side electrode 14 and the p-side electrode 15 is a stack of a first conductive layer 19a to a fourth conductive layer 19d.

The first conductive layer 19a may be made of, for example, transparent conductive oxide (TCO) such as indium tin oxide (ITO). In detail, the first conductive layer 19a in this embodiment is made of ITO. The thickness of the first conductive layer 19a may be, for example, about 50 nm to 100 nm. The first conductive layer 19a may be formed by, for example, a thin-film formation method such as sputtering or chemical vapor deposition (CVD).

The second conductive layer 19b to the fourth conductive layer 19d may be made of a metal such as Cu or an alloy. In detail, in this embodiment, each of the second conductive layer 19b and the third conductive layer 19c is made of Cu, and the fourth conductive layer 19d is made of Sn. The thicknesses of the second conductive layer 19b to fourth conductive layer 19d may be, for example, about 50 nm to 1000 nm, about 10 μm to 20 μm, and about 1 μm to 5 μm, respectively.

In this embodiment, the second conductive layer 19b from among the first conductive layer 19a to the fourth conductive layer 19d forms a seed layer. The seed layer is a layer from which plating growth starts. The seed layer is typically made of a metal or an alloy. The second conductive layer 19b as the seed layer may be formed by, for example, a thin-film formation method such as sputtering, deposition, printing, or inkjet, other than plating.

In this embodiment, the third conductive layer 19c and the fourth conductive layer 19d are each composed of a plating film.

In this embodiment, the semiconductor stack structure of one conductivity type (the n-type semiconductor stack structure 12) having the i-type amorphous semiconductor layer 12i formed on the back surface 10b and the n-type amorphous semiconductor layer 12n formed on the i-type amorphous semiconductor layer 12i is an example of the "semiconductor layer of one conductivity type", and the semiconductor stack structure of the other conductivity type (the p-type semiconductor stack structure 13) having the i-type amorphous semiconductor layer 13i formed on the back surface 10b and the p-type amorphous semiconductor layer 13p formed on the i-type amorphous semiconductor layer 13i is an example of the "semiconductor layer of an other conductivity type".

The "semiconductor layer of one conductivity type" and the "semiconductor layer of an other conductivity type" in the present disclosure are, however, not limited to such. For example, the i-type amorphous semiconductor layer 12i and the i-type amorphous semiconductor layer 13i may be omitted.

Manufacturing Method in Embodiment 1

The method of manufacturing the solar cell 1 in Embodiment 1 is described below, with reference to FIGS. 3 to 9.

Figure 3:
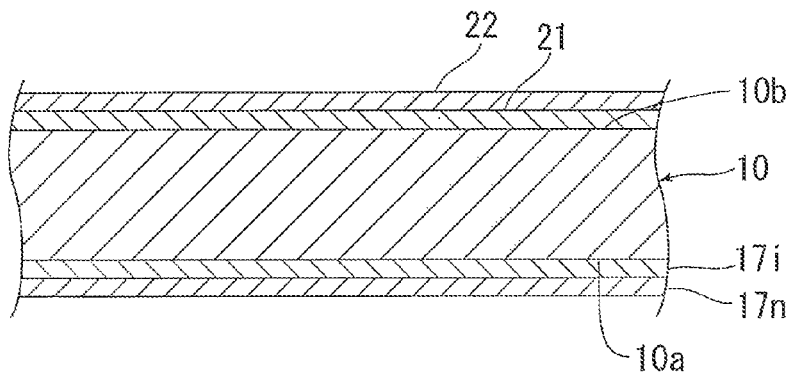
FIG. 3 is a schematic sectional view illustrating a solar cell manufacturing step in Embodiment 1.

First, the semiconductor substrate 10 is prepared. Next, the i-type amorphous semiconductor layer 17i and the n-type amorphous semiconductor layer 17n are formed on the light receiving surface 10a of the semiconductor substrate 10, and an i-type amorphous semiconductor layer 21 and an n-type amorphous semiconductor layer 22 are formed on the back surface 10b of the semiconductor substrate 10, as illustrated in FIG. 3. The method of forming each of the i-type amorphous semiconductor layers 17i and 21 and the n-type amorphous semiconductor layers 17n and 22 is not particularly limited. Each of the i-type amorphous semiconductor layers 17i and 21 and the n-type amorphous semiconductor layers 17n and 22 may be formed by, for example, CVD such as plasma CVD.

Figure 4:
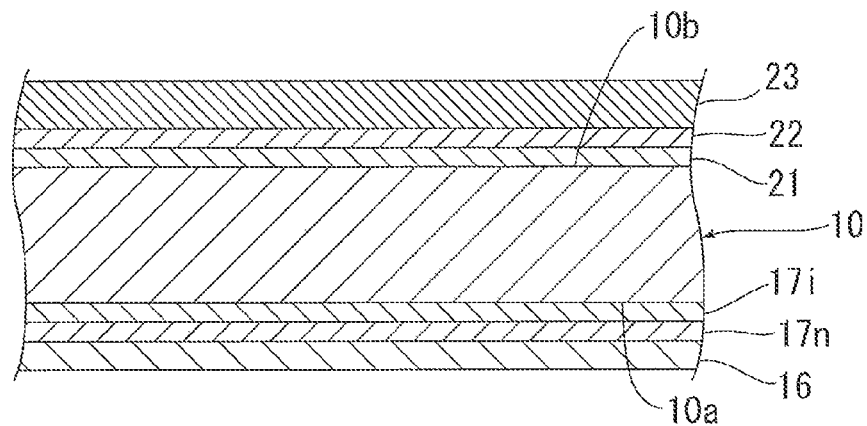
FIG. 4 is a schematic sectional view illustrating a solar cell manufacturing step in Embodiment 1.

Following this, the insulation layer 16 is formed on the n-type amorphous semiconductor layer 17n, and an insulation layer 23 is formed on the n-type amorphous semiconductor layers 22, as illustrated in FIG. 4. The method of forming each of the insulation layers 16 and 23 is not particularly limited. Each of the insulation layers 16 and 23 may be formed by, for example, a thin-film formation method such as sputtering or CVD.

Figure 5:
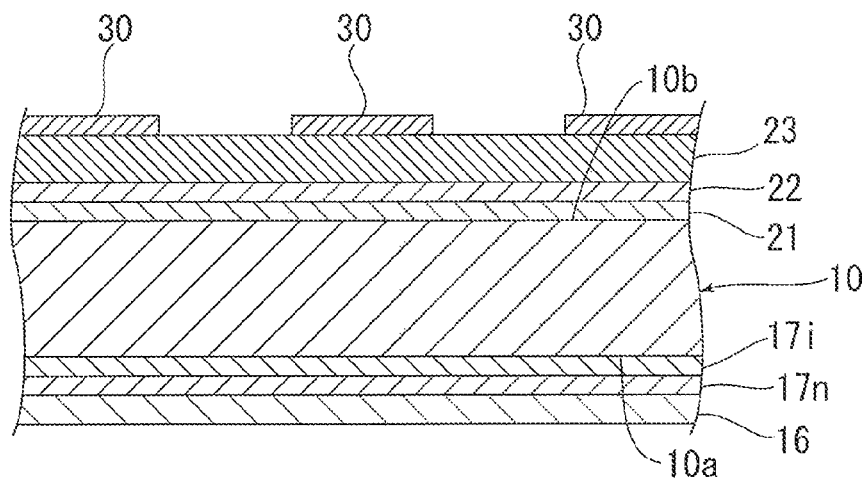
FIG. 5 is a schematic sectional view illustrating a solar cell manufacturing step in Embodiment 1.

Next, an etching paste 30 is applied to the insulation layer 23 in a predetermined first region, as illustrated in FIG. 5. In detail, the etching paste 30 is applied to the insulation layer 23 in the region where the p-type semiconductor stack structure 13 is joined to the semiconductor substrate 10. The etching paste 30 is such an etching paste that can etch the insulation layer 23, the i-type amorphous semiconductor layer 21, and the n-type amorphous semiconductor layer 22.

An example of such an etching paste 30 is a resin paste containing phosphoric acid ($H_3PO_4$). The material contained in the etching paste 30 is not limited to phosphoric acid ($H_3PO_4$), and may be any material having an erosive action on the insulation layer 23, the i-type amorphous semiconductor layer 21, and the n-type amorphous semiconductor layer 22.

The condition of etching using the etching paste 30 is to heat to a temperature, about 200° C. as an example, at which phosphoric acid ($H_3PO_4$) exerts an erosive action on the insulation layer 23, the i-type amorphous semiconductor layer 21, and the n-type amorphous semiconductor layer 22. In the case where a material other than phosphoric acid ($H_3PO_4$) is used, the condition of etching using the etching paste 30 is to heat to a temperature at which the material exerts an erosive action.

Figure 6:
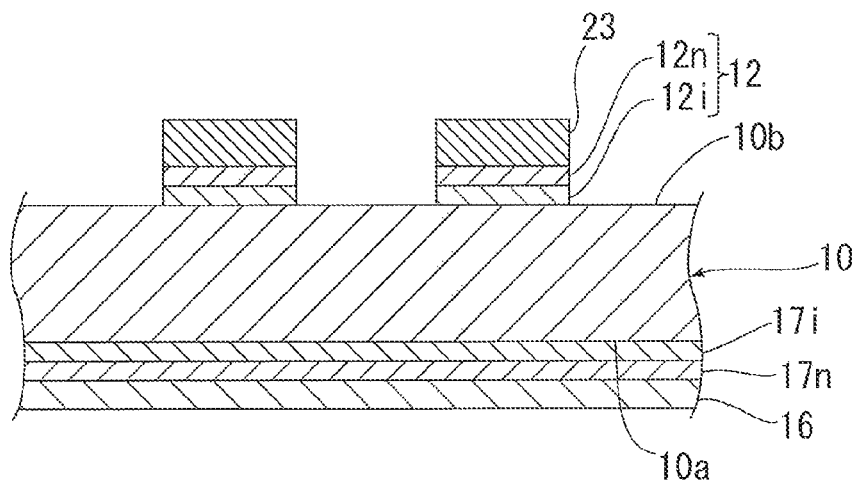
FIG. 6 is a schematic sectional view illustrating a solar cell manufacturing step in Embodiment 1.

The etching paste 30 is used to etch to remove the part of each of the insulation layer 23, i-type amorphous semiconductor layer 21, and n-type amorphous semiconductor layer 22 corresponding to the predetermined first region. The predetermined first region relates to the region R2. As a result, the i-type amorphous semiconductor layer 12i and the n-type amorphous semiconductor layer 12n (see FIG. 2) are formed as illustrated in FIG. 6.

Next, an i-type amorphous semiconductor layer 24 and a p-type amorphous semiconductor layer 25 are formed in this order so as to cover the back surface 10b, as illustrated in FIG. 7. The method of forming each of the amorphous semiconductor layers 24 and 25 is not particularly limited. The amorphous semiconductor layers 24 and 25 may be formed by, for example, CVD.

The part of each of the amorphous semiconductor layers 24 and 25 corresponding to a predetermined second region is then removed by etching, as illustrated in FIG. 8. The predetermined second region corresponds to a part on the insulation layer 23. The predetermined second region relates to the region R1. Thus, the i-type amorphous semiconductor layer 13$i$ and the p-type amorphous semiconductor layer 13$p$ are formed from the amorphous semiconductor layers 24 and 25. This step may be performed using an etching paste as in the etching of the insulation layer 23, i-type amorphous semiconductor layer 21, and n-type amorphous semiconductor layer 22, or performed by wet etching or dry etching using a resist mask and an etching agent. This embodiment describes the case of using wet etching. A first etching agent having a higher etching rate for the amorphous semiconductor layers 24 and 25 than for the insulation layer 23 is used in this step. Hence, the amorphous semiconductor layers 24 and 25 are etched from among the amorphous semiconductor layers 24 and 25 and the insulation layer 23.

Specific examples of the first etching agent include an alkaline aqueous solution such as a NaOH aqueous solution containing NaOH or a KOH aqueous solution containing KOH and a mixed acid of nitric acid and ammonia, in the case where the amorphous semiconductor layers 24 and 25 are made of silicon and the insulation layer 23 is made of silicon oxide, silicon nitride, or silicon oxynitride. A resist mask (not illustrated) is formed on the p-type amorphous semiconductor layer 25 except the predetermined second region, and the above-mentioned etching agent is used to etch to remove the amorphous semiconductor layers 24 and 25 in the predetermined second region.

After this, the insulation layer 23 is etched as illustrated in FIG. 9. In detail, using the amorphous semiconductor layers 13$i$ and 13$p$ as a mask, the exposed part of the insulation layer 23 is removed by etching with a second etching agent. As a result, the n-type amorphous semiconductor layer 12$n$ in the predetermined second region is exposed, and the insulation layer 18 is formed from the insulation layer 23. The second etching agent having a higher etching rate for the insulation layer 23 than for the amorphous semiconductor layers 24 and 25 is used in this step. Hence, the insulation layer 23 is etched from among the insulation layer 23 and the amorphous semiconductor layers 24 and 25. Specific examples of such a second etching agent include an acidic aqueous solution such as a HF aqueous solution containing HF or a phosphoric acid aqueous solution, in the case where the amorphous semiconductor layers 24 and 25 are made of silicon and the insulation layer 23 is made of silicon oxide, silicon nitride, or silicon oxynitride.

Thus, the n-type semiconductor stack structure 12 including the i-type amorphous semiconductor layer 12$i$ and the n-type amorphous semiconductor layer 12$n$ and the p-type semiconductor stack structure 13 including the i-type amorphous semiconductor layer 13$i$ and the p-type amorphous semiconductor layer 13$p$ can be formed on the back surface 10$b$ of the semiconductor substrate 10.

Next, an electrode formation step of forming the n-side electrode 14 and the p-side electrode 15 respectively on the n-type amorphous semiconductor layer 12$n$ and the p-type amorphous semiconductor layer 13$p$ is performed as in the method described in PTL 1. This completes the solar cell 1 illustrated in FIG. 2.

In detail, the first conductive layer 19$a$ made of TCO and the second conductive layer 19$b$ made of a metal such as Cu or an alloy are formed in this order by a thin-film formation method such as CVD, e.g. plasma CVD, or sputtering. The part of the layers on the insulation layer 18 corresponding to a predetermined third region is then removed to form the first conductive layer 19$a$ and the second conductive layer 19$b$ illustrated in FIG. 2. This removal may be performed by, for example, wet etching or dry etching using a resist mask and an etching agent.

Following this, the third conductive layer 19$c$ made of Cu and the fourth conductive layer 19$d$ made of Sn are formed in this order on the first conductive layer 19$a$ and the second conductive layer 19$b$ by electrolytic plating. The n-side electrode 14 and the p-side electrode 15 illustrated in FIG. 2 are thus completed.

The solar cell 1 illustrated in FIG. 2 can be manufactured in the way described above.

In this embodiment, the etching paste 30 is used to simultaneously etch to remove the insulation layer 23, the i-type amorphous semiconductor layer 21, and the n-type amorphous semiconductor layer 22. This eases the manufacture of the solar cell.

Manufacturing Method in Embodiment 2

Figure 10:
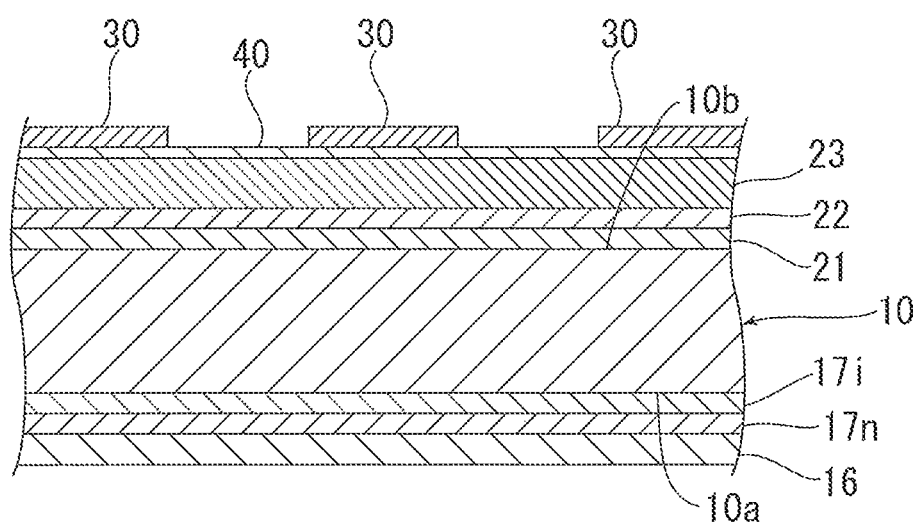
FIG. 10 is a schematic sectional view illustrating a solar cell manufacturing step in Embodiment 2.

FIG. 10 is a schematic sectional view illustrating a solar cell manufacturing step in Embodiment 2. In this embodiment, after the insulation layer 23 is formed as illustrated in FIG. 4 in Embodiment 1, an organic layer 40 is formed on the insulation layer 23. The organic layer 40 may be a water-repellent organic layer. Examples of the organic substance forming the organic layer 40 include a silicone-based fluororesin, a paraffin-based resin, an ethyleneurea-based resin, a methylol azide-based resin, a silicone-based resin, and a fluorine-based resin. The organic layer 40 is formed by a method of immersing the semiconductor substrate 10 having the insulation layer 23 in the organic substance (immersion), a method of supplying the evaporated organic substance to the surface of the insulation layer 23, or a method of spraying the organic substance with a spray gun (spray coating).

The thickness of the organic layer 40 is preferably greater than the thickness of a monomolecular layer and less than 1 μm.

In this embodiment, the etching paste 30 is applied to the organic layer 40, as in the step illustrated in FIG. 5 in Embodiment 1. Therefore, the step of applying the etching paste 30 in this embodiment includes the step of forming the organic layer 40 on the insulation layer 23 and the step of applying the etching paste 30 to the organic layer 40 in the predetermined region.

Since the etching paste 30 is applied to the organic layer 40 in this embodiment, the angle of contact with the base (the organic layer 40) of the etching paste 30 can be increased. This reduces oozing and spreading of the etching paste 30, and improves the patterning property of the etching paste 30.

The etching paste 30 used in this embodiment may be the same as the etching paste used in Embodiment 1. The etching paste 30 is used to etch to remove the part of each of the organic layer 40, insulation layer 23, i-type amorphous semiconductor layer 21, and n-type amorphous semiconductor layer 22 corresponding to the predetermined region, as in Embodiment 1. The organic layer 40 is then removed. The method of removing the organic layer 40 may be a method of immersing, in a cleaning liquid, the semiconductor substrate 10 to which the organic layer 40 has been attached. In the case where the cleaning liquid is an alkaline aqueous solution such as a sodium hydroxide (NaOH) aqueous solution, the organic layer 40 and the etching paste 30 can be removed simultaneously.

After the insulation layer 23, the i-type amorphous semiconductor layer 21, and the n-type amorphous semiconductor layer 22 are removed by etching as described above, the solar cell 1 can be manufactured in the same way as in Embodiment 1.

Although each of the foregoing embodiments describes an example where one conductivity type is n-type and the other conductivity type is p-type, this is not a limitation, and one conductivity type may be p-type and the other conductivity type n-type. Although each of the foregoing embodiments describes a back contact solar cell as an example, this is not a limitation, and solar cells other than back contact type are equally applicable.

In the case where an etching paste is used in the step of etching the amorphous semiconductor layers 24 and 25 illustrated in FIG. 9, the organic layer used in Embodiment 2 may be formed on the amorphous semiconductor layers 24 and 25 before applying the etching paste. This reduces oozing and spreading of the etching paste and improves the patterning property of the etching paste, as in the case of etching the insulation layer 23, the i-type amorphous semiconductor layer 21, and the n-type amorphous semiconductor layer 22.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell manufacturing method comprising:
    forming a first amorphous semiconductor layer of one conductivity type on a main surface of a semiconductor substrate;
    forming an insulation layer on the first amorphous semiconductor layer;
    etching to remove the insulation layer and the first amorphous semiconductor layer in a predetermined first region at a time;
    forming a second amorphous semiconductor layer of the other conductivity type on the insulation layer after the etching, the other conductivity type being different from the one conductivity type; and
    etching to remove the second amorphous semiconductor layer in a predetermined second region,
    wherein the etching to remove the insulation layer and the first amorphous semiconductor layer in a predetermined first region at a time includes:
    applying an etching paste to the insulation layer only in the predetermined first region in an entire region of the insulating layer; and
    etching to remove the insulation layer and the first amorphous semiconductor layer in the predetermined first region using the etching paste applied, to remove the insulation layer and the first amorphous semiconductor layer in the predetermined first region at a time.

2. The solar cell manufacturing method according to claim 1, further comprising:
    forming a conductive layer on the first amorphous semiconductor layer and the second amorphous semiconductor layer, after the etching to remove the second amorphous semiconductor layer in a predetermined second region; and
    etching to remove the conductive layer in a predetermined third region.

3. The solar cell manufacturing method according to claim 2,
    wherein the etching to remove the conductive layer in a predetermined third region includes:
    forming a resist mask in a region other than the predetermined third region; and
    etching to remove the conductive layer in the predetermined third region using an etching agent.

4. The solar cell manufacturing method according to claim 1,
    wherein the applying an etching paste includes:
    forming an organic layer on the insulation layer; and
    applying the etching paste to the organic layer in the predetermined first region.

5. The solar cell manufacturing method according to claim 4,
    wherein the organic layer includes at least one of: a silicone-based fluororesin; a paraffin-based resin; an ethyleneurea-based resin; a methylol azide-based resin; a silicone-based resin; and a fluorine-based resin.

6. The solar cell manufacturing method according to claim 1,
    wherein the semiconductor substrate is a crystalline semiconductor substrate.

7. The solar cell manufacturing method according to claim 6,
    wherein the crystalline semiconductor substrate is a crystalline silicon substrate.

8. The solar cell manufacturing method according to claim 6,
    wherein the first amorphous semiconductor layer and the second amorphous semiconductor layer are each an amorphous silicon layer.

9. The solar cell manufacturing method according to claim 6,
    wherein the insulation layer comprises any one of silicon nitride, silicon oxide, and silicon oxynitride.

10. A solar cell manufacturing method comprising:
    forming a first amorphous semiconductor layer of one conductivity type on a main surface of a semiconductor substrate;
    forming an insulation layer on the first amorphous semiconductor layer;
    etching to remove the insulation layer and the first amorphous semiconductor layer in a predetermined first region;
    forming a second amorphous semiconductor layer of the other conductivity type on the insulation layer after the etching, the other conductivity type being different from the one conductivity type; and
    etching to remove the second amorphous semiconductor layer in a predetermined second region,
    wherein the etching to remove the insulation layer and the first amorphous semiconductor layer in a predetermined first region includes:
    applying an etching paste to the insulation layer in the predetermined first region; and
    etching to remove the insulation layer and the first amorphous semiconductor layer in the predetermined first region using the etching paste, the applying an etching paste includes:
    forming an organic layer on the insulation layer; and
    applying the etching paste to the organic layer in the predetermined first region.

* * * * *